United States Patent [19]

Sanders et al.

[11] 4,261,096
[45] Apr. 14, 1981

[54] PROCESS FOR FORMING METALLIC GROUND GRID FOR INTEGRATED CIRCUITS

[75] Inventors: Thomas J. Sanders, Indialantic; William R. Morcom, Melbourne Beach; Jacob A. Davis, Indialantic, all of Fla.

[73] Assignee: Harris Corporation, Melbourne, Fla.

[21] Appl. No.: 25,435

[22] Filed: Mar. 30, 1979

Related U.S. Application Data

[60] Division of Ser. No. 906,380, May 16, 1978, Pat. No. 4,174,562, which is a continuation-in-part of Ser. No. 689,441, May 24, 1976, abandoned, which is a division of Ser. No. 561,677, Mar. 25, 1975, Pat. No. 3,974,517, which is a continuation of Ser. No. 412,118, Nov. 2, 1973, abandoned.

[51] Int. Cl.$^3$ ............................................. B01J 17/00
[52] U.S. Cl. ...................................... 29/578; 29/589; 29/590; 204/15
[58] Field of Search .................. 29/577, 578, 589, 590; 204/15; 357/48

[56] References Cited

U.S. PATENT DOCUMENTS

| 3,423,650 | 1/1969 | Cohen | 357/48 |
| 3,634,203 | 1/1972 | McMahon | 357/65 |
| 3,726,002 | 4/1973 | Greenstein | 29/577 |
| 3,961,414 | 6/1976 | Humphreys | 29/578 |

*Primary Examiner*—W. C. Tupman
*Attorney, Agent, or Firm*—Leitner, Palan, Martin & Bernstein

[57] ABSTRACT

A metallic ground grid is fabricated by forming a conductor on the isolation barrier of an integrated circuit through openings in a first insulated layer to a depth less than the first insulated layer, forming a second insulated layer on said first conductor to the height of the first insulated layer, and interconnecting selected areas of the integrated circuit and the first conductor through openings in the insulated layers by a second conductor.

3 Claims, 7 Drawing Figures

PROCESS FOR FORMING METALLIC GROUND GRID FOR INTEGRATED CIRCUITS

CROSS REFERENCE TO RELATED APPLICATIONS

This is a divisional application of co-pending application Ser. No. 906,380, filed May 16, 1978, now U.S. Pat. No. 4,174,562 and which is a continuation-in-part of application Ser. No. 689,441, filed May 24, 1976, now abandoned; which is a divisional application of application Ser. No. 561,677, filed Mar. 25, 1975, now U.S. Pat. No. 3,974,517, which is a continuation of application Ser. No. 412,118, filed Nov. 2, 1973, now abandoned.

BACKGROUND OF THE INVENTION

1. Field of the Invention

The present invention relates generally to integrated circuits and more specifically to a low resistant metallic ground grid for integrated circuits.

2. Description of the Prior Art

The ever-increasing complexity of integrated circuits has led to large chip sizes. One problem with these large circuit areas is the resistant drop in the ground metallization line between the ground pad and all other ground points in the circuit. Many times the ground line's resistance is significant enough to cause ground voltage drop problems in some junction isolated circuits.

In junction isolated circuits having substantial amounts of current flowing in the substrate, the ground line is only part of the consideration. The current flowing in the substrate has to also flow through a highly resistive isolation diffusion until it can get into the metallized ground line through conveniently placed ground tap, which is common to the metallized ground line and the isolated diffusion.

The prior art provides generally a ground path by diffusion into the semiconductive body of the integrated circuit or by a metal ground conductor formed on an insulating layer on the surface of the integrated circuit. In order to keep the resistance per square relatively small, the diffused ground paths are generally made wide, thus reducing the packing density of the integrated circuit. The metal ground conductors of the prior art are difficult to form on uneven surfaces of the integrated circuit without breaking or having pinholes and without shorting out other portions of the integrated circuit through imperfections in the insulating layer. Also, the metal ground conductor of the prior art requires the formation of a surface insulating layer at all points at which metal interconnects must cross over. This is not only responsible for the increase in expense of the integrated circuit, but also adds restraint to the circuit layout.

SUMMARY OF THE INVENTION

The method of the present invention provides a metallic ground grid where the resistive drop is due to the isolation diffusion and can be nearly reduced to zero while at the same time various parallel paths are provided which can aid in carrying current to the ground path. According to the present invention, a pattern is etched in the oxide over the diffused isolation regions using a photoresist mask to expose the isolation regions of an integrated circuit. With the resist still on the oxide layer, the metal conductor is formed on the integrated circuit. The conductor is to be thinner than the combined oxide and photoresist layer and preferably thinner than the oxide layer. After stripping the photoresist along with metal that has been deposited thereon, the remaining conductor is partially anodized so that an insulating layer covers the conductor at least to the remaining height of the oxide layer. Apertures are then formed in the anozided layer and the oxide layer on the remainder of the integrated circuit so that conductors can be formed to connect selected areas of the integrated circuit to the ground grid with a minimum ground line resistance.

OBJECTS OF THE INVENTION

An object of the present invention is to provide a low resistance ground grid for integrated circuits.

It is another object of the present invention to provide a method for forming a low resistance ground grid for integrated circuits.

It is a further object of the present invention to provide a metallic ground grid which may be connected to selected areas of an integrated circuit and require no additional steps of producing an insulated layer thereon for conductor crossovers to the integrated circuit.

Other objects, advantages and novel features of the present invention will become apparent from the following detailed description of the invention when considered in conjunction with the accompanying drawings.

DESCRIPTION OF THE PREFERRED EMBODIMENT

Figure 1:
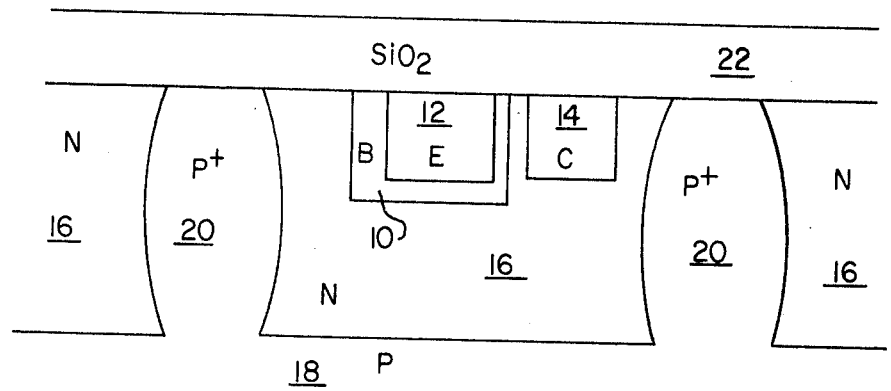
FIGS. 1-5 are cross-sectional views of successive stages of development in the fabrication of the metallic ground grid of the present invention in an integrated circuit.

Referring to FIG. 1, a transistor having a base 10 and an emitter 12, a collector 14 is shown being formed in a spaced apart planar region 16 formed in a substrate 18. A plurality of the planar regions 16 having an N conductivity type are shown separated by isolation barriers or regions 20 of P+ conductivity type, also formed in the P type substrate 18. The planar surface of the integrated circuit is coated with a non-conductive material 22 such as silicon dioxide (but any relatively smooth, non-conductive material will work for this purpose). The silicon dioxide can be formed on the silicon substrate by oxidizing the silicon in a steam ambient at 1,100° C. for about an hour. As depicted in FIG. 1, the integrated circuit is at a point where all the diffusions for semiconductive devices are complete and a circuit is ready for a normal contact aperture mask process. Though only a transistor is shown in the present drawings, it is to be understood that the remaining regions 16 each have a semiconductor device formed therein as needed for a designed integrated circuit.

Before the normal contact aperture formation steps, the pattern for the metallic ground grid is defined. Preferably this is achieved by the application of a photoresist emulsion and its delineation. A positive photoresist such as Shipley can be used and has provided exellent results with glass substrates. Photoresist may be applied by brushing, dipping, spinning or other coating techniques. Once applied, the photoresist is exposed using a mask and developed so as to define the pattern of the metallic ground grid. The photoresist layer 24 and the non-conductive layer 22 are etched to form apertures or grid pattern 26 above the isolation barrier regions 20 as shown in FIG. 2.

With the photoresist still on the integrated circuit, a layer 28 of conductive material is deposited in apertures 26 to a thickness less than the thickness of the combination of non-conductive layer 22 and the photoresist layer 24. This insures the discontinuity in the conductive material layer 28 on top of the photoresist 24 and the conductor 28 in the apertures 26. Preferably, the conductive material is aluminum evaporated onto the substrate at room temperature. Other conductive metals may be used and deposited by other well known methods of the prior art.

Figure 2:
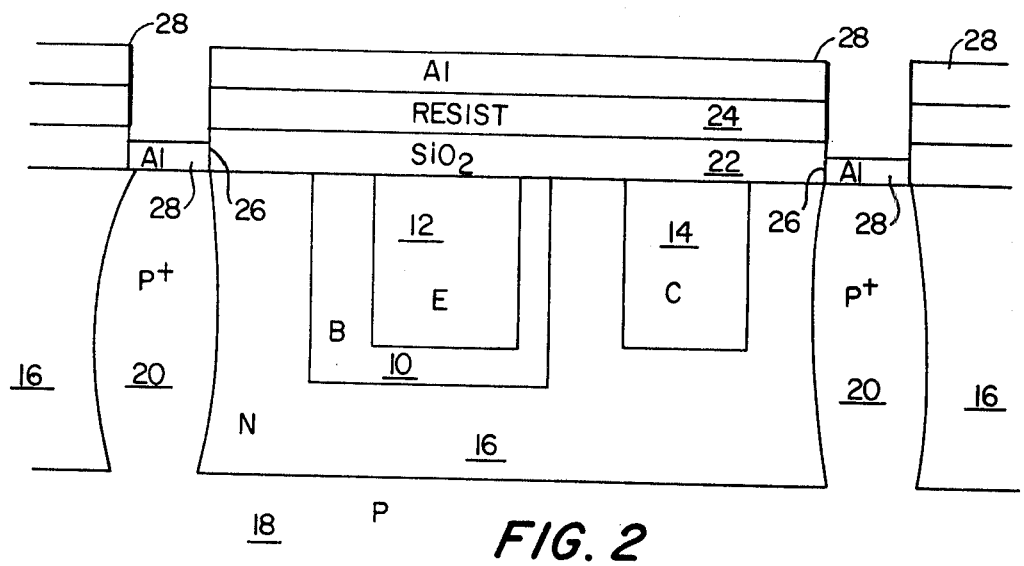
Figure 3:
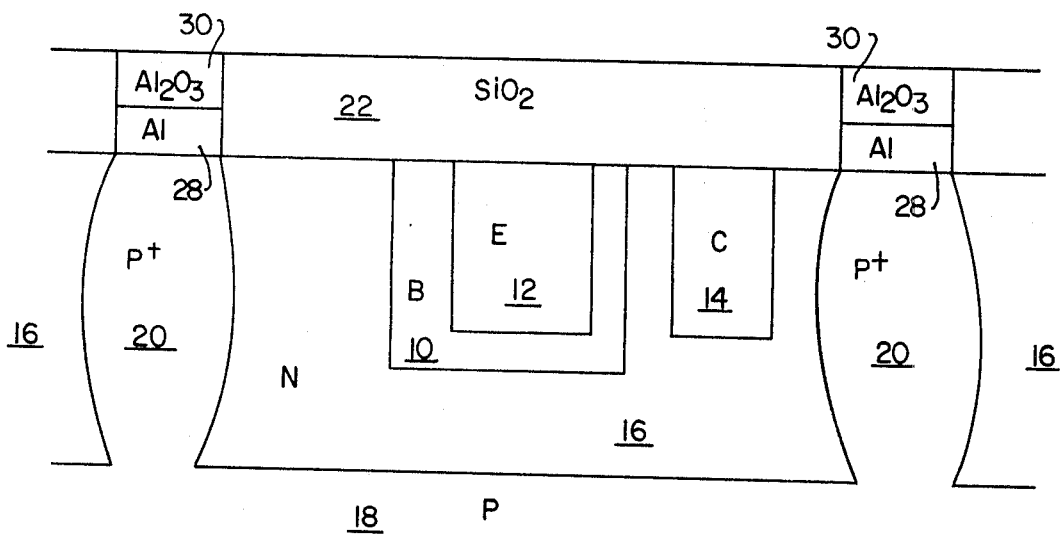
Figure 5:
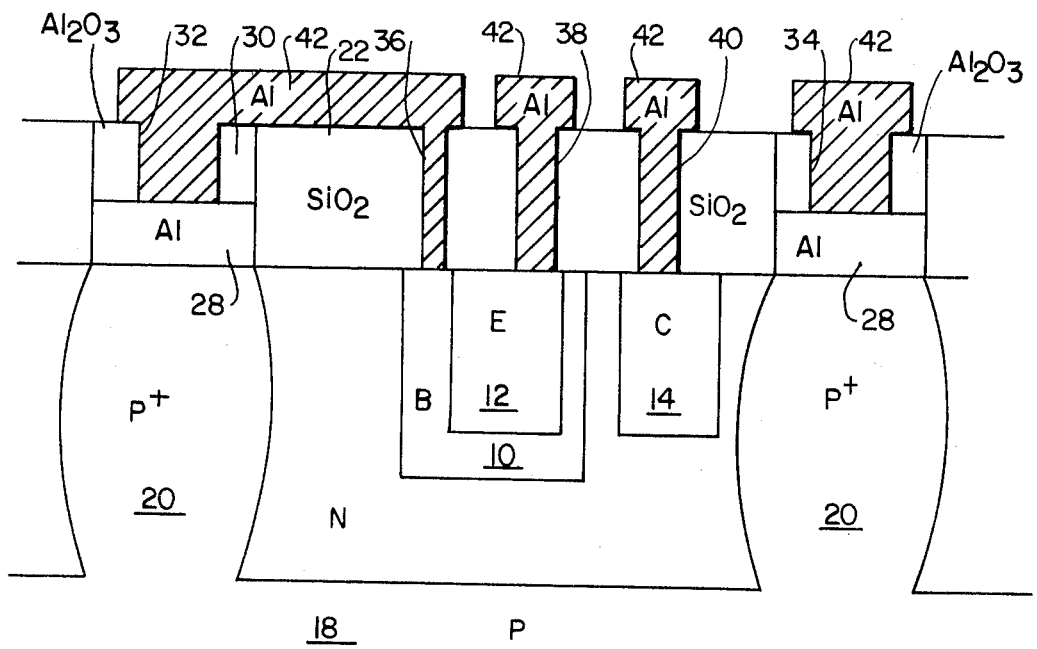
Figure 6:
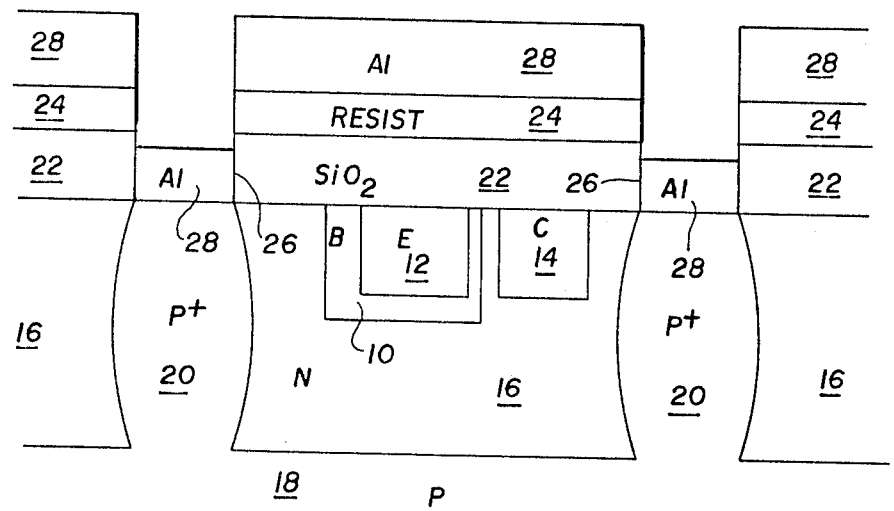
FIGS. 6 and 7 are cross-sectional views of an alternative method of fabrication incorporating the principles of the present invention.
Figure 7:
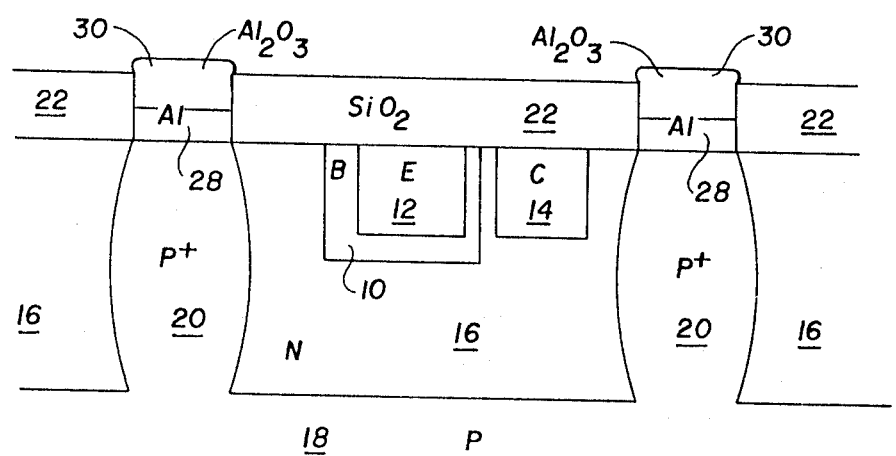

Since it is desirable to produce as planar a surface as possible after anodization as illustrated in FIG. 3, the conductive material 28 is applied to have a thickness less than the thickness of non-conductive layer 22 as illustrated in FIG. 2. Alternatively, the conductive material 28 may be applied to have a thickness substantially equal to the thickness of non-conductive layer 22 as illustrated in FIG. 6. After anodization, an aluminum oxide layer 30 would protrude above the surface of non-conductive layer 22 as illustrated in FIG. 7. If the protrusions are small enough so as not to be detrimental to interconnectors passing over them, the fabrication can be completed using the steps illustrated in FIGS. 4 and 5. The protrusions may also be removed mechanically or chemically to form a planar surface with non-conductive layer 22 as illustrated in FIG. 3. If protrusions are unacceptable, the conductor 28 may be applied of a thickness substantially less than the non-conductive layer 22 and anodized to a combined thickness less than the thickness of non-conductive layer 22.

Alternatively, if the conductive material 28 is applied to have a thickness equal to the thickness of non-conductive layer 22, the non-conductive layer 22 may be increased before the conductive material 28 is anodized to form a planar surface after anodization.

The photoresist layer 24 and the conductive layer 28 thereon are removed chemically. Using the Shipley photoresist, acetone is generally used to chemically remove or strip the photoresist. A contact baked at 400° C. for one hour is performed to insure proper adherence of the conductor to the doped silicon planar surface of the isolation barrier 20. The conductive grid has a thickness of approximately 5,000 angstroms and a resistance of 0.1 ohms per square. The contact bake may be performed in an oxidizing atmosphere so as to increase the thickness of non-conductive layer 22. This step would increase the probability of obtaining a planar surface after anodization even with the conductor thickness of FIG. 6.

The aluminum pattern remaining in apertures 26 is then partially anodized so that a layer of aluminum oxide 30 covers the remaining or non-anodized portion of aluminum conductor 28. The anodization is performed at 100 volts in a solution of oxalic acid. As shown in FIG. 3, the metal oxide layer 30 fills the remainder of aperture 26 and forms a generally planar surface with the insulative layer 22. The metal oxide layer 30 provides an added adequate insulator for allowing interconnecting metals to pass over the isolation regions without making contact with the ground grid deposited as described above without major surface protrusions. The anodization should be performed for a sufficient thickness to electrically isolate the conductor 28 from interconnectors at the surface. The increase of thickness of the combined conductor 28 and metal oxide layer 30 above the thickness of the original conductor 28 produced by anodization preferably forms a planar surface with non-conductive layer 22 as illustrated in FIG. 3, although minor protrusions illustrated in FIG. 7 are acceptable. The integrated circuit is now ready to have the contact apertures opened.

Figure 4:
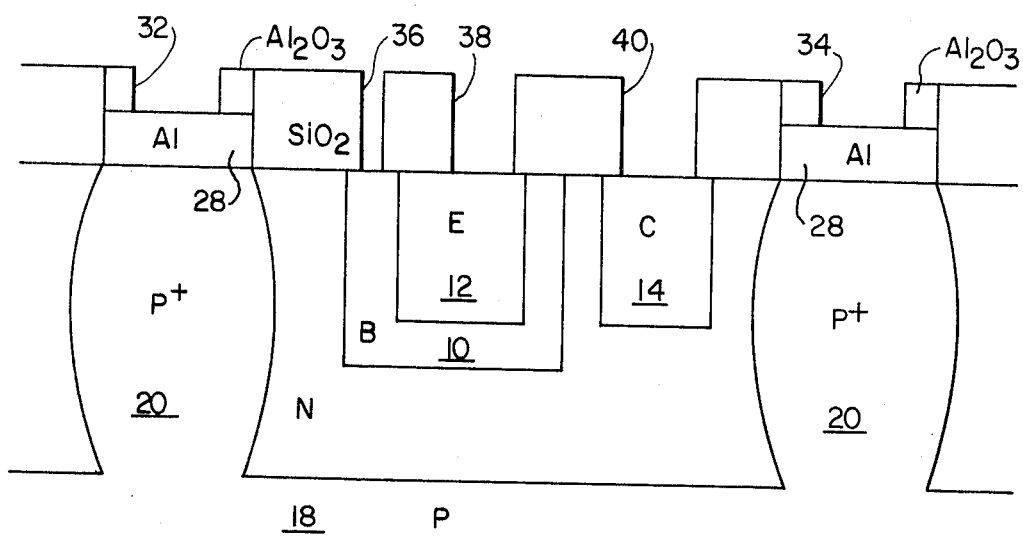

The integrated circuit is processed through a conventional photoresist operation, during which contact apertures in selected regions of the integrated circuit as well as selected areas above the metallic grid 28 are formed in a layer of photosensitive material coated on the planar surface defined by insulators 22 and 30. The contact apertures delineated by the photoresist material are formed by exposing the photoresist coated slice to a hydrofluoric acid etch solution which will remove all the oxide from those areas of the wafer not coated by the photoresist. The photoresist is then removed in a series of baths in J-100 stripper. The exposed areas left by the above photoresist etch are those in which the interconnections are made between selected areas of semiconductive devices in the integrated circuit and the metallic ground grid 28. As shown in FIG. 4, the apertures 32 and 34 expose selected areas of metallic ground grid 28 and apertures 36, 38 and 40 expose selected areas to base 10, emitter 12 and the collector 14 of the illustrated transistor.

The final step includes depositing and delineation, by conventional means, of the connector and interconnector metals of the integrated circuit. Generally, a layer of an aluminum of approximately 10,000 angstroms is applied; however, other conductive metals may be used. Preferably a direct photoresist technique is used to delineate the aluminum connectors and interconnectors. The aluminum is evaporated over the entire substrate, followed by a coat of photoresist. The photoresist is exposed through a mask and etched to achieve the desired pattern of the connectors and interconnectors as shown in FIG. 5 as layer 42. As specifically shown, the base of the transistor 10 is connected to the ground metallic grid 28 by the aluminum layer 42 filling apertures 32 and 36, respectively, and crossing the insulative layers 22 and 30.

The metal grid pattern 28 formed on the planar surface above isolation barriers 20 provides an extensive low resistive ground pattern which alleviates undesired resistive ground drops in integrated circuits. With the application of the grid 28 prior to the formation of contact apertures in the integrated circuit, the need for the formation of insulative crossover regions on the semiconductor at select locations is eliminated. The formation of the metal oxide layer 30 over the whole surface of the metallic ground grid 28 provides a more effective insulator and reduces the number of steps required to selectively insulate the metallic ground grid 28. Thus, the process as described above produces a low resistive metallic ground grid which is economical to produce.

Although the invention has been described and illustrated in detail, it is to be clearly understood that the same is by way of illustration and example only and is not intended to be taken by way of limitation. The semiconductive transistor shown is but an example of the type of semiconductor devices which may be formed in junction isolated regions in a planar integrated circuit. The metallic ground grid was preferably formed with aluminum because of its excellent adherence characteristics to silicon, yet other conductive metals may be used. Similarly, the formation of silicon dioxide and aluminum oxide as the insulating layers are but expedient examples of insulators and other insulators well known in the art may be used. The spirit and scope of the invention is limited only by the terms of the appended claims.

What is claimed is:

1. A process for fabricating an integrated circuit having a plurality of planar regions of a first conductivity type separated by planar isolation barriers of an opposed second conductivity type and having semiconductor components formed in said planar regions comprising:

forming a first insulated layer on said planar regions with said planar isolation barriers exposed;

forming a first continuous conductor on said exposed isolation barriers having a thickness equal to the thickness of said first insulated layer;

oxidizing said first conductor to form a second insulated layer on said first conductor, thus reducing the thickness of said first conductor below that of said first insulated layer and having a combined thickness sufficient to extend above said first insulated layer;

removing portions of said second insulated layer to produce a substantially planar surface with said first insulated layer;

forming select apertures in said first and second insulated layers to expose planar areas of said semiconductor components and areas of said first conductor respectively; and forming a plurality of second conductors interconnecting said exposed planar areas and said exposed first conductor areas.

2. A process as in claim 1, wherein forming said first insulated layer includes forming an insulated layer on said planar regions of a first thickness and defining a second planar surface and forming openings in said first insulated layer using a masking material of a second thickness to expose said isolation barrier; and wherein forming said first conductor includes applying a layer of said first conductor of a third thickness, less than the sum of said first and second thicknesses, on said masking material and said exposed isolation barriers and removing said masking material and said first conductor superimposed thereon.

3. A process for fabricating an integrated circuit having a plurality of planar regions of a first conductivity type separated by planar isolation barriers of an opposed second conductivity type and having semiconductor components formed in said planar regions comprising:

forming a first insulated layer on said planar regions with said planar isolation barriers exposed;

forming a first continuous conductor on said exposed isolation barriers having a thickness equal to the thickness of said first insulated layer;

increasing the thickness of said first insulated layer to recess said first conductor below the surface of the increased first insulated layer with the top of said first conductor exposed;

oxidizing said first conductor to form a second insulated layer on said first conductor having a thickness sufficient to produce a substantially planar surface with said increased first insulated layer;

forming select apertures in said first and second insulated layers to expose planar areas of said semiconductor components and areas of said first conductor respectively; and forming a plurality of second conductors interconnecting said exposed planar areas of said exposed first conductor areas.

* * * * *